(12) United States Patent
Lane

(10) Patent No.: US 11,515,122 B2
(45) Date of Patent: Nov. 29, 2022

(54) SYSTEM AND METHODS FOR VHF PLASMA PROCESSING

(71) Applicant: Tokyo Electron Limited, Tokyo (JP)

(72) Inventor: Barton Lane, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 124 days.

(21) Appl. No.: 16/357,731

(22) Filed: Mar. 19, 2019

(65) Prior Publication Data

US 2020/0303164 A1 Sep. 24, 2020

(51) Int. Cl.
*H01J 3/32* (2006.01)
*H01L 21/67* (2006.01)
*H01J 37/32* (2006.01)

(52) U.S. Cl.
CPC ..... *H01J 37/3211* (2013.01); *H01J 37/32183* (2013.01); *H01J 37/32715* (2013.01); *H01L 21/67069* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,565,738 A | * | 10/1996 | Samukawa | H01J 37/3211 315/111.51 |
| 5,716,451 A | * | 2/1998 | Hama | H01J 37/321 118/723 I |
| 6,030,667 A | * | 2/2000 | Nakagawa | H01J 37/321 427/569 |
| 6,089,182 A | * | 7/2000 | Hama | C23C 16/00 118/723 AN |
| 6,149,760 A | * | 11/2000 | Hama | H01J 37/321 118/723 I |

(Continued)

FOREIGN PATENT DOCUMENTS

| | | |
|---|---|---|
| JP | 2016-91812 A | 5/2016 |
| KR | 10-2017-0017748 A | 2/2017 |

OTHER PUBLICATIONS

International Search Report and Written Opinion dated Jun. 4, 2020 in PCT/US2020/016741, 11 pages.

*Primary Examiner* — Ram N Kackar
*Assistant Examiner* — Laureen Chan
(74) *Attorney, Agent, or Firm* — Oblon, McClelland, Maier & Neustadt, L.L.P.

(57) ABSTRACT

This disclosure relates to a plasma processing system for VHF plasma processing using a transmission antenna designed to enable a resonant VHF standing wave inside a plasma process chamber used to manufacture semiconductor devices. The system includes a transmission element capable of being electromagnetically coupled to incoming power lines connected to a power source. The transmission element, power transmission lines, and power source form a resonant circuit capable of enabling a VHF standing wave on the transmission element. The transmission element is folded back on itself to reduce the footprint of the antenna, such that the transmission element(s) can be located inside the plasma process chamber. The transmission antenna has three portions, with the first being electromagnetically coupled to the power transmission line, the second being coupled to plasma, and the third being a folded portion that reduces the transmission element's footprint.

12 Claims, 4 Drawing Sheets

(56) References Cited

U.S. PATENT DOCUMENTS

| | | |
|---|---|---|
| 6,667,577 B2 | 12/2003 | Shannon et al. |
| 9,253,867 B2 | 2/2016 | Yamazawa et al. |
| 9,831,091 B2 | 11/2017 | Liu et al. |
| 9,997,332 B2 | 6/2018 | Yamazawa et al. |
| 10,290,504 B2 | 5/2019 | Liu et al. |
| 10,325,758 B2 | 6/2019 | Yamawaku et al. |
| 2002/0060523 A1* | 5/2002 | Bhardwaj ............ H01J 37/321 315/111.21 |
| 2003/0111962 A1 | 6/2003 | Shannon et al. |
| 2011/0008550 A1* | 1/2011 | Murata ................ H01J 37/321 427/569 |
| 2011/0094997 A1 | 4/2011 | Yamazawa et al. |
| 2012/0012252 A1* | 1/2012 | Kusumoto ........... H01J 37/321 156/345.24 |
| 2012/0031562 A1* | 2/2012 | Setsuhara ........... H01J 37/3211 156/345.48 |
| 2013/0102155 A1* | 4/2013 | Gang .................... H01J 37/321 438/710 |
| 2013/0220548 A1* | 8/2013 | Setsuhara ............. C23C 16/507 156/345.48 |
| 2014/0144584 A1* | 5/2014 | Koo ................... H01J 37/32091 156/345.48 |
| 2014/0202634 A1* | 7/2014 | Ramaswamy .... H01J 37/32183 315/111.21 |
| 2015/0126037 A1* | 5/2015 | Chen ................ H01J 37/32899 438/711 |
| 2016/0071701 A1* | 3/2016 | Lane ................ H01J 37/32174 156/345.28 |
| 2016/0126063 A1 | 5/2016 | Yamawaku et al. |
| 2016/0172160 A1* | 6/2016 | Yamazawa ........... H01J 37/3244 156/345.48 |
| 2016/0217978 A1* | 7/2016 | Mai .................... H01J 37/32669 |
| 2016/0358781 A1 | 12/2016 | Liu et al. |
| 2017/0040170 A1 | 2/2017 | Guha et al. |
| 2018/0082847 A1 | 3/2018 | Liu et al. |
| 2018/0308662 A1 | 10/2018 | Yamazawa et al. |
| 2020/0219708 A1* | 7/2020 | Long ................ H01L 21/67069 |

\* cited by examiner

SYSTEM AND METHODS FOR VHF PLASMA PROCESSING

FIELD OF THE DISCLOSURE

This invention relates to semiconductor processing equipment technology, and more particularly, to apparatus and methods for controlling plasma used for treating a semiconductor substrate.

BACKGROUND

The geometries of microelectronic features continue to scale to smaller sizes and increase in complexity. Accordingly, the patterning techniques for manufacturing microelectronic devices will become more precise to create smaller features on semiconductor substrates. Precise patterning requires tighter control over processing parameters such as ion and radical fluxes at each point on the wafer in order that sufficient numbers of processed dies yield working chips for the process to be economically successful. One aspect of the patterning process includes etching features using plasma to selectively remove materials from the substrate. One approach to improving plasma etch techniques relates to controlling plasma in a predictable and uniform manner. For example, electromagnetic waves in the VHF frequency range (30 MHz to 300 MHz) are known to produce high density plasmas (termed herein "VHF plasmas"). Additionally, VHF plasmas form relatively thin, low energy sheaths between the plasma edge and the substrate which enables lower ion acceleration for ions used to kinetically remove or etch films on the substrate. The lower ion energy can improve selectivity and reduce damage to underlying films. However, VHF plasma processing has not been favored due to non-uniform spatial plasma profiles. This non-uniformity is due to the nature of the VHF electromagnetic waves whose wavelength is comparable to the process chamber dimensions and to non-linear interactions between the electromagnetic waves and the plasma. These qualities make it difficult to obtain uniform density profiles across a wafer and make it very difficult to try to tailor the density profile on scale lengths which are shorter than the size of the wafer; this is often desirable in order to compensate for non-uniformities coming from other sources such as gas distribution. Accordingly, VHF systems and methods that improve plasma uniformity (e.g., spatial profile) and enable control of the plasma density profile on length scales smaller than the wafer would be desirable.

SUMMARY

Disclosed herein are systems and methods for plasma processing for microelectronic device manufacturing. Particularly, for very high frequency (VHF) (e.g., 30-300 MHz) electromagnetic waves used to ionize gas within a process chamber or process space that is comparable in size (200 mm-500 mm) relative to a typical VHF wavelength (1000 mm-10,000 mm). Generally, VHF plasma processing is capable of generating a high density plasma that forms relatively thin, low energy plasma sheaths compared to lower frequency plasma generation techniques. The plasma sheath is observed as the potential difference between the substrate and plasma, across which ions from the plasma are accelerated to kinetically interact with the substrate. The smaller sheath size enabled by the VHF processing reduces the ions' kinetic energy compared to non-VHF processing. The lower energy ions impart less energy to the substrate, which can improve the etch selectivity between an overlying and underlying film, such that selectivity is improved by maximizing the removal of the overlying film while removing as little of the underlying film as possible. Selectivity improvements can enable patterning of smaller and/or more complex (e.g., 3D structures) features on the substrate.

The systems and methods described herein are intended to remedy the spatial profile issues by focusing the effect of the VHF energy within a smaller area or footprint using one or more plasma production elements each of which may be controlled separately or collectively to ionize the gas within the process chamber. The system incorporates power transmission elements disposed within the process chamber above a substrate holder, which are capable of forming a resonant circuit(s) between a VHF power source(s) and the resonant antennas disposed within the power transmission elements. When power is applied to the resonant antennas energy will be transferred to the gases which flow into the process chamber to form a plasma (e.g., ionized gas), wherein the power comprises a relatively higher VHF frequency to achieve relatively high plasma density and a smaller plasma sheath between the plasma and the substrate, as compared to lower frequency excitation techniques (e.g., <30 MHz). The ions may be drawn to the plasma sheath and may be accelerated through the plasma sheath towards the substrate to kinetically interact with the substrate.

In one embodiment, the transmission elements may include a pair of resonant antennas formed by a conductive material disposed within a dielectric material, such that the antennas are not in physical contact with each other, but may be electrically coupled to each other via a capacitive coupling component. The antenna(s) may be formed using conductive material arranged into an open loop with various portions of the antenna capable of being selectively coupled to an incoming power supply (e.g., capacitive portion) and gas within the process chamber (e.g., inductive portion) at the same time. The inductive portion may be arranged to run parallel to the plasma processing region or the substrate holder with the capacitive portion located opposite the inductive portion and arranged to run parallel to an incoming power transmission line, which supplies electrical energy to the antenna In one specific embodiment, the capacitive portion may be folded back with one or more folds to reduce the overall footprint of the antenna while maintaining sufficient length to enable the antenna to form a resonant circuit with a VHF power source. In this way, the antenna folding enables a relatively large electrical length of VHF antenna to be placed within the process chamber by using an antenna with a smaller footprint, horizontal surface area, or volume. The smaller footprint antenna enables the use of VHF energy with a relatively large wavelength within in a relatively small plasma processing region, which had not been possible in the past. The resonant circuit may be formed based, at least in part, on the capacitive portion arranged or configured to be capacitively coupled to an alternating power source that drives current within the entire antenna. Under known resonance principles, the resonant circuit will amplify the incoming power signal to achieve a relatively higher current flow within the antenna. The current driven through the inductive portion of the loop may be inductively coupled to the gas proximate to the dielectric material, in that the coupling induces a current flow within the ionized gas controlled by the current flow through the inductive portion of the loop. In other words, the antenna may be designed of sufficient length and/or size to form a resonant circuit with a VHF power source via coupling with the first portion of the loop (e.g., capacitive portion) and the orienting the location of the second portion of the loop (e.g., inductive portion), within the dielectric material, to couple the antenna with process chamber gas to generate plasma within the process chamber.

In one embodiment, the plasma processing chamber may include an alternating power source that applies VHF energy to the antennas disposed within a dielectric material, which form a resonant circuit between the resonant elements and the power source, when the VHF energy is applied at a resonance frequency. In this way, the resonant elements may generate inductive fields with the electric field being parallel to the plasma sheath, which permits the fields to penetrate into the plasma. Although the fields generated by the antennas, and/or the power source, may penetrate into the plasma they may avoid surface modes with polarizations perpendicular to the plasma sheath which propagate naturally and disperse energy to portions of the reactor distance from the antenna but in an uncontrolled fashion. In the past, directional control issues may have been countered by using higher amplitude energy, but the higher amplitudes could drive the fields into non-linear regimes, which increase process and hardware complexity, which erased the cost/quality benefits of using VHF plasma processing. By way of example, and not limitation, a resonant element may include a conductive structure arranged in an open loop (e.g., capacitive, inductive, and conduit portions) which is embedded within a dielectric material which provides physical support for the conductive structure and isolates it from the process chemistry during the process. For example, a dielectric component of the transmission element may include an exterior surface with a top surface and a bottom surface, opposite the top surface, with the top surface being closest to the incoming VHF signal and the bottom surface being opposite a substrate holder within the plasma processing chamber. The dielectric component may include one or more transmission antennas embedded within the dielectric structure, such that the transmission antenna is physically isolated from the exterior surface of the dielectric component, in that current does not flow directly through the dielectric material from the power source to the transmission antenna. Broadly, the transmission antenna may be, in one embodiment, a looped conductive structure comprising a first portion (e.g., inductive portion) of the transmission antenna being opposite of the bottom surface of the dielectric component, a second portion (e.g., capacitive portion) of the transmission antenna being opposite of the top surface of the dielectric component; and, a third portion (e.g., conduit portion) of the transmission antenna disposed between and connected to the first portion and the second portion. The first portion, the second portion, and third portion of the transmission antenna may form a continuous conductive element, such that current can flow between each of the portions when the transmission antenna is capacitively coupled to a power source.

In one embodiment, the transmission antenna may be arranged, such that the first portion may be parallel to the bottom surface and the second portion may be parallel to the top surface, and the third portion may be disposed between the first and second portion, such that third portion may be folded or oriented in a way to reduce the footprint, area, or volume in which the transmission antenna is enclosed. In some instances, the third portion may have a longer length than the first portion or the second portion, but may be folded back on to itself to confine the footprint, or horizontal surface area, of the third portion within same or similar footprint of the first portion or the second portion. In one particular embodiment, the first portion has a length of at least 50 mm and a thickness of 10 µm to 100 µm of a conductive material. The folded portions of the transmission antenna being part of the continuous conductive structure of the transmission antenna, but can be separated by dielectric material to avoid shorting between any overlapping or folded sections of the second portion of the antenna. The dielectric material may include any material capable of minimizing shorting between the folded sections, which may include, but is not limited to, materials such as alumina, quartz, silicon carbide, or combination thereof. In some instances the dielectric material may have a yttrium oxide coating on at least one surface to minimize chemical reactivity between the dielectric material and the process chemistry.

In another embodiment, two or more transmission antennas may be embedded in the dielectric component, the combination of the transmission antenna and the dielectric component is referred to as a transmission element. The transmission antennas may include a coupling component disposed proximate to each transmission antenna, such that the coupling component may electrically couple to, or form a capacitor between, the transmission antennas with or without the transmission antennas being in direct physical contact with each other or the coupling component. The coupling component may enable the transmission antennas to be powered in a parallel or anti-parallel manner from one or more power sources. For instance, when the power transmissions applied to the transmission antennas are in phase (e.g., parallel) amplifies the emitted signal strength via the principle of superposition, likewise the emitted signal may be modulated when the incoming power to each transmission antenna is out-of-phase (e.g., anti-parallel). The capacitive coupling between the two transmission antennas breaks a polarization degeneracy so that the parallel and anti-parallel modes have different frequencies and by choosing the appropriate combination of two frequencies, enables control over the thickness of the ionization region within the process chamber. However, the process chamber is not limited to using only one transmission element to control plasma density or spatial profile.

Transmission elements, as described herein, may be arranged together within the process chamber to influence spatial profile control and/or plasma density during substrate treatments. For example, one or more transmission elements may be disposed within a plasma processing chamber having an interior volume with a substrate holder disposed within the interior volume, and a power source that provides power to a power component(s) opposite a portion of the transmission antenna. The power component may be designed and positioned to generate an electromagnetic field using the current provided by the power source, such that the electromagnetic field induces current flow within the transmission antenna(s). For example, the power source may be electrically connected to a power component comprising one or more power transmission lines that emit electromagnetic fields which can form a resonant circuit with the transmission antenna, when power is applied at a particular resonance frequency. A resonant circuit is enabled based, at least in part, on impedance of the transmission antenna or impedance matching between the transmission antenna, power transmission line, and the power source. In most VHF embodiments, the combination of the power component and transmission element are designed to achieve a resonance frequency when the power source is operating between 30 MHz and 300 MHz.

In a multi-transmission antenna embodiment, the two or more transmission antennas may be disposed within a single dielectric component and arranged to be electrically coupled to each other via a coupling component disposed within the dielectric component. In one embodiment, the coupling component is a conductive element arranged to form a capacitor between the two transmission antennas. The coupling component may or may not be in physical contact with the transmission antennas. However, in one specific embodiment, the coupling component is separated from the transmission antennas by the dielectric material in which the transmission antennas are embedded.

The transmission elements disclosed herein may be used for any type of plasma processing including, but not limited to, semiconductor substrates used for the manufacture of electrical devices, displays, and/or solar panels. The methods may be implemented on any substrate being treated with plasma generated by ionizing or applying electrical energy to a gas being maintained at sub-atmospheric pressure in the plasma chamber. In one embodiment, the substrate may be received in a plasma chamber and secured to a substrate holder while the plasma chamber is prepared to receive a process chemistry (e.g., gas) at a desired pressure, temperature, and/or time. Energy may be introduced into the plasma chamber by applying electrical energy from a power source (e.g., alternating power source) coupled to the plasma processing chamber to induce a transmission current within the power transmission line that is opposite a transmission element or dielectric structure including one or more transmission antennas. The power transmission line and transmission element are arranged, such that the power transmission line current will induce current flow within one or more transmission antennas based, at least in part, on an electric field caused by the transmission current in the power component. In certain instances, a resonant circuit may be formed between the power source, power transmission line, and the transmission antenna(s) based, at least in part, on impedance of the transmission antenna(s) and a frequency (e.g., resonance frequency) of the electrical energy generated by the power source. The resonance effect will amplify the incoming power to the transmission antenna to the gas in the process chamber, such that the fields generated by the power transmission line has a lower amplitude than an amplitude of the electromagnetic fields emanating from the transmission antenna(s). In most instances, the electromagnetic energy transmitted by the transmission antenna will have sufficient energy to ionize the gas disposed between the transmission antenna(s) and the substrate, with the ionized gas (e.g., plasma) being used to treat the substrate.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION OF THE DRAWINGS

The following Detailed Description of the drawings includes exemplary embodiments that will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
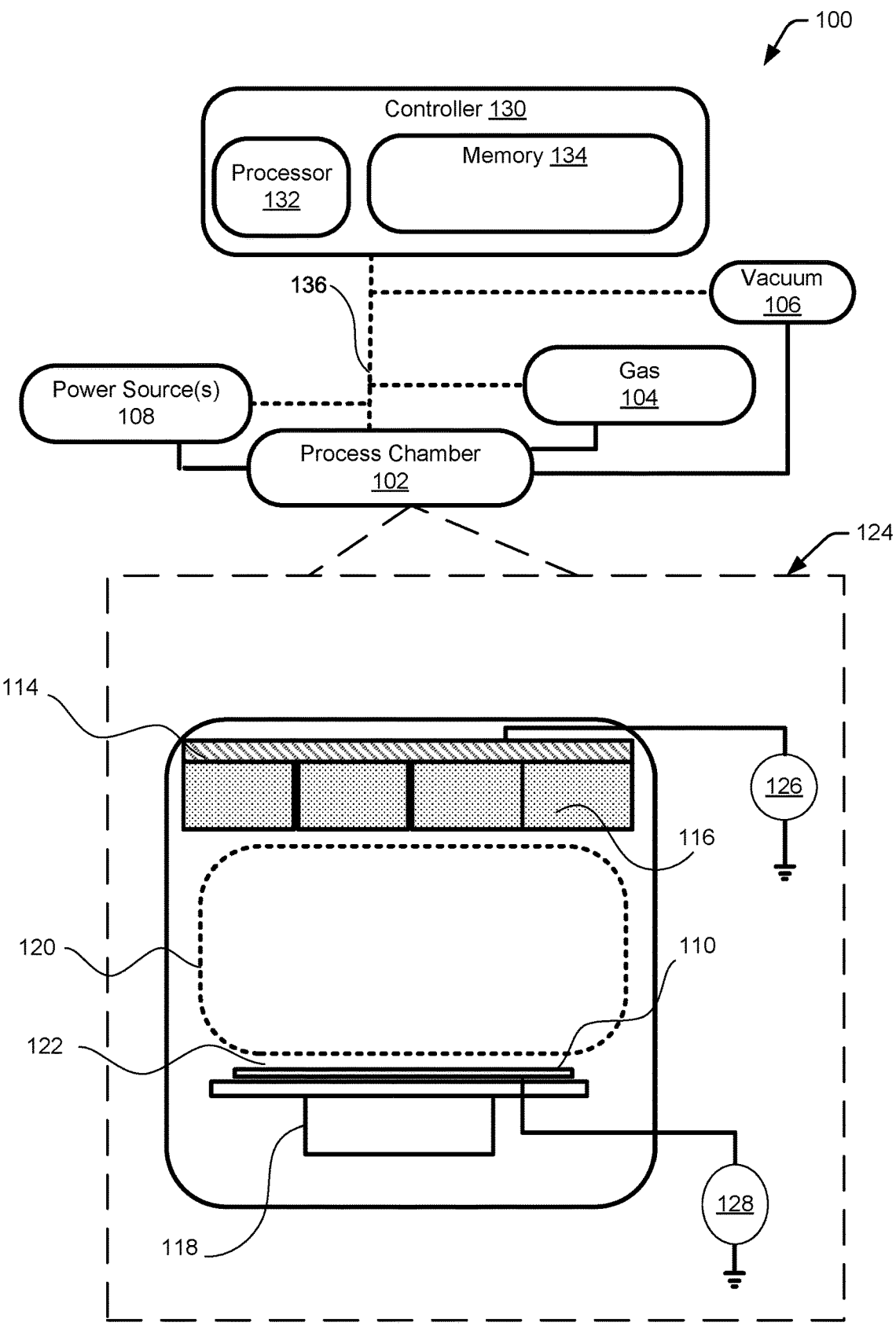
FIG. 1 is an illustration of a representative embodiment of a plasma processing system that shows a schematic cross-sectional illustration of a plasma chamber including the power component, transmission element, and the substrate holder according to one or more embodiments of the disclosure.

FIG. 1 depicts a plasma processing system 100 for treating substrates using plasma (not shown) formed by applying electromagnetic energy to a process chemistry disposed inside the interior volume of the plasma chamber 102. The process chemistry may be introduced to the plasma chamber 102 via a gas delivery network 104, which may include gas conduits integrated with mass flow controllers, check valves, and the like to control the gas flow into the plasma chamber 102. Additionally, a vacuum system 106, in fluid communication with the plasma chamber 102, may collaboratively control the pressure or gas flow with the gas delivery network 104 by maintaining sub-atmospheric pressure during plasma generation and removing by-products from the treatment process. By way of example, and not limitation, the vacuum system 106 may include one or more pumps and control systems (e.g., $N_2$ ballast system, butter-fly valve system) to control the pressure within the plasma chamber 102.

Broadly, plasma generation may be done by applying electromagnetic energy (e.g., power source(s) 108) to an electrically neutral gas to cause electrons to be released from gas molecules that are left positively charged (e.g., ions) as result of the lost electron. The ions may be characterized as a molecule or atom where the total number of electrons are not equal to the total number of protons resulting in a positive charge. Molecular or atomic radicals (e.g., molecules or atoms with at least one unpaired electron) may also be generated from the electrically neutral gas. Generally, the radicals may have a neutral charge and may have high chemical reactivity relative to the ions. Over time, the electromagnetic energy and the increasing electron collisions within the gas mixture may increase the density of ionized molecules and radicals within the gas mixture and may be used to treat the substrate 110.

The plasma chamber system 100 may alter certain process conditions to influence the amount of flow of ions and/or radicals towards the substrate, such that the ionized molecules may be influenced by potential differences within the plasma chamber 102. For example, the potential differences within the plasma chamber 102 may direct the ionized molecules (or atoms, or radicals) towards a substrate 110. The ions and radicals may interact with the substrate 110 and alter the surface of the substrate 110 or remove a portion of the substrate 110, or overlying film, that is exposed to the plasma. In certain applications, plasma treatment selectivity and control are important factors for patterning smaller and smaller feature sizes for electronic devices. Lower ion energies can improve selectivity between two overlaying films on the substrate 110, such that the overlying film is sufficiently removed while minimizing the removal or damage to the underlying film. One approach to achieving higher etch selectivity is using lower ion energies. This is achieved by minimizing the plasma sheath, or potential barrier, formed between plasma and the substrate's 110 surface when the net flux of electrons and ions reach a steady state. If the plasma sheath is larger for a given plasma density, the amount of energy that ions gain in crossing the sheath will be greater. However, the higher ion energies can lead to more aggressive treatments which are more difficult to control for selectivity and uniformity purposes. VHF plasma processing is known to produce high density plasma and relatively small plasma sheaths that enable lower ion energies, However, the nature of VHF plasma (e.g, high frequency) may cause non-uniform spatial plasma profiles based, at least in part, on the propagating waves having a wavelength that is comparable to the process chamber 102. Because the wavelength is comparable to the process chamber dimensions, the fields over certain regions of the wafer such as the center are larger than the electromagnetic fields at the edge of the wafer causing a similar non-uniformity in the plasma density. On the other hand the fact that the wavelength is comparable to the process chamber dimensions means that even if it is possible to adjust the phase of the waves so that the regions of high fields are in desired areas, the length scale over which the plasma density can be controlled are comparable to the wafer dimension and therefore no local control is possible to offset other non-uniformities caused by for example by gas distribution, etch by product evacuation, wafer temperature non-uniformities or non-uniformities arising from an earlier process step that must be compensated for. Hence, the wavelength size makes it problematic to localize the high density and small sheath effects in a controllable manner within the plasma chamber 102.

VHF plasma processing may be a practical alternative to existing processing techniques using the systems and method disclosed herein to enable a controllable spatial density profile and a relatively small sheath size permitting low damage, highly selective processing. The system may include an alternating power source (e.g., power source(s) 108) that applies VHF energy to form an electromagnetic field along a power component(s) 114 that induces current flow within one or more antenna(s) (not shown) within the transmission element(s) 116 disposed between the power component 114 and the substrate holder 118. The VHF energy may be applied at a resonance frequency to form a resonance circuit between the power component 114 and the transmission element 116 to generate plasma 120 and a corresponding plasma sheath 122 (not to scale) opposite the substrate 110. The plasma sheath 122 is observed as the potential difference between the substrate 110 and plasma 120 and acts to equilibrate electron and ion flow to the substrate 110. Ions are accelerated across this sheath naturally but their final energy may be increased by using one or more biasing techniques (e.g., substrate holder biasing) to impart additional energy to accelerate the ions across the plasma sheath 122 to kinetically interact with the substrate 110.

The resonance circuit, formed between the power component 114 and the transmission elements 116, may generate inductive fields with the electric field polarization being parallel to the plasma sheath edge 122, which permits the fields to penetrate the plasma and avoid surface modes which have polarizations which are perpendicular to the plasma sheath 122. Although the fields generated by the antennas, and/or the power source, may penetrate the plasma they may avoid surface modes with polarizations perpendicular to the plasma sheath 122 which may impact directional control of the ions causing non-uniform etching on the substrate 110. In the past, directional control issues may have been countered by using higher amplitude energy, but the higher amplitudes could drive the fields into non-linear regimes, which increase process and hardware complexity and erase the cost/quality benefits of using VHF plasma processing.

In FIG. 1, the plasma chamber 102 cross section illustration 124 illustrates one embodiment of a power component 114 that enables the transmission of electromagnetic energy (e.g., microwave energy, RF energy) and the gas mixture (not shown) into the region proximate to the substrate 110. The gas mixture may be introduced into the plasma processing region between the transmission element 116 and the substrate holder 118. The plasma processing region (e.g., plasma 120) may also receive energy from a VHF energy source 126 that is used to induce a resonance response from the transmission element 116. The electromagnetic energy may include electromagnetic energy (e.g., radio-frequency (RF) energy @<300 MHz) that may transmitted, via an electrical conduit (not shown), from the VHF energy source 126 to the power component 114. In the FIG. 1 embodiment, the current flow through the power component 114 is driven by a single VHF energy source 126, which generates a corresponding electromagnetic field around the power component 114, which may induce parallel current flow within the antennas (not shown) in the transmission element 116. In this instance, a single power component 114 can be designed to apply energy to multiple transmission elements 116. However, in other embodiments, multiple power components 114 may apply power to one or more transmission elements 114 depending on the desired application or degree of localized plasma density or sheath size. Accordingly, two or more VHF energy sources 126 may be arranged to apply power signals at different resonance frequencies depending on the impedance (e.g., antenna design) between the power component 114 and the transmission element 116, which will be described in the description of FIGS. 2-3.

In addition to the VHF energy source 126, the gas mixture in the plasma processing region may also receive electromagnetic energy from a second source (e.g., bias power source 128) that may bias the substrate holder 118 and/or substrate 110 to influence the plasma characteristics proximate to the substrate 110. In some embodiments, the bias power source 128 and the VHF energy source 126 may be operated in unison or alone to generate plasma 120 within the plasma processing region. In one embodiment, the bias power source 128 may be an RF power source that may provide more than 50 W of power at 10 MHz or higher. The biasing of the substrate holder 118 and the power component 114 may be implemented by using a controller 130 that may coordinate the process sequencing that enables plasma generation within the plasma processing region.

The controller 130 may use a computer processor 132 and memory 134 to execute computer-readable instructions that may be provided over an electrical communication network 136 to control the plasma processing system 100 components (e.g., power sources 108, gas delivery 104, etc.). The one or more computer processors 132 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The memory 136 may include one or more computer-readable storage media ("CRSM"). In some embodiments, the one or more memories may include non-transitory media such as random access memory ("RAM"), flash RAM, solid state media, and so forth. Broadly, the controller 130 may control the sequencing of processing events that enable plasma generation or to transition between different types of plasma that may be exposed to the substrate 110.

Figure 2:
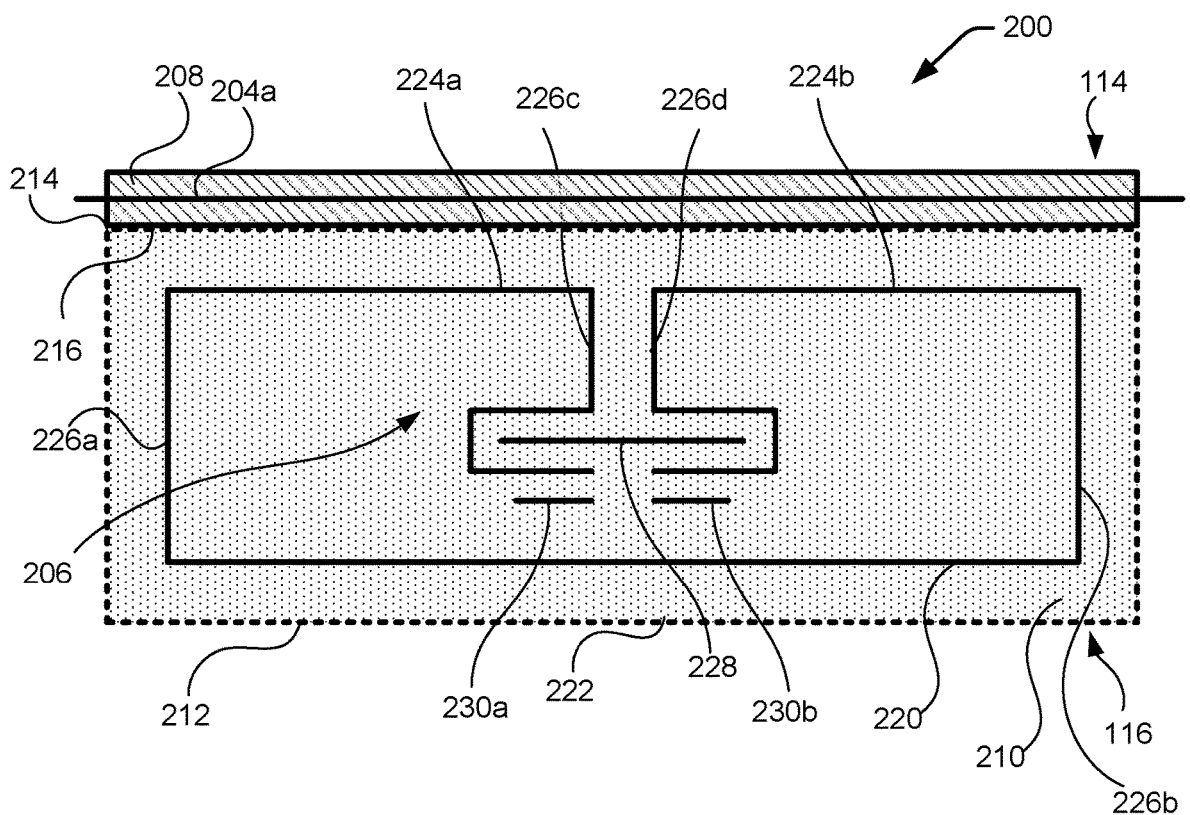
FIG. 2 includes a side-view cross-section and top-view cross-section illustrations of the power component with power transmission lines and the transmission element with a transmission antenna disposed within a dielectric structure according to one or more embodiments of the disclosure.
Figure 2:
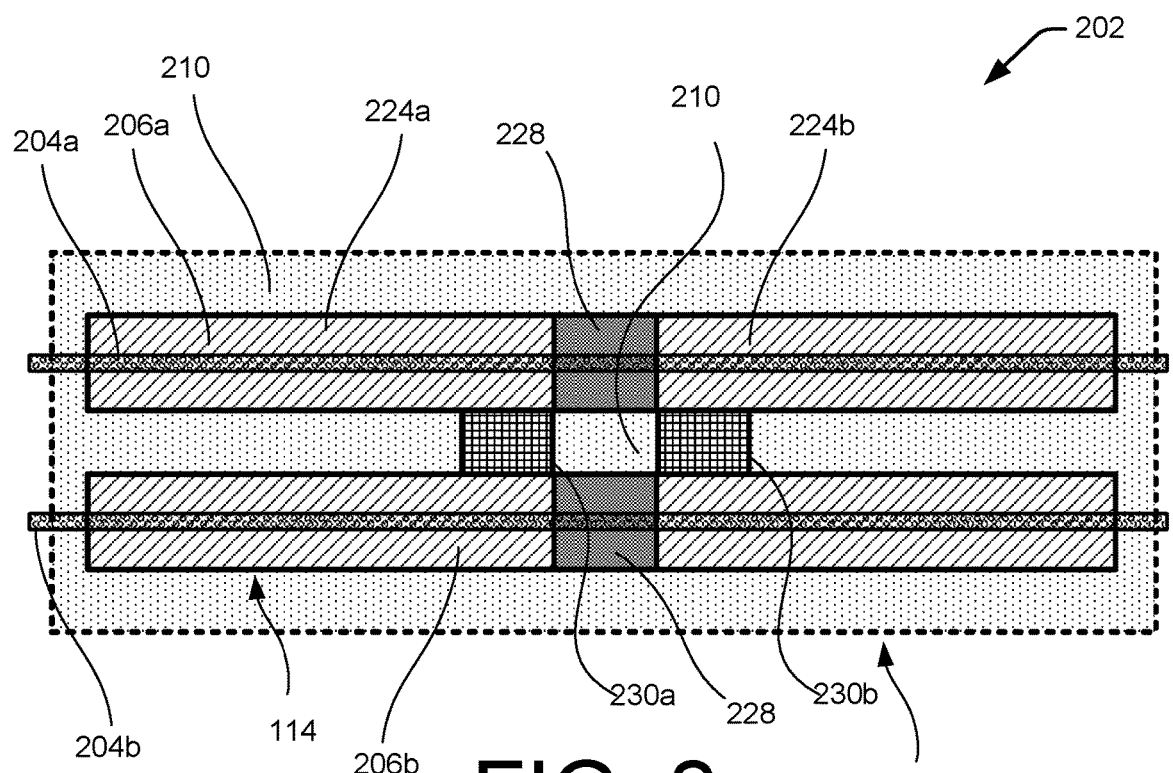

FIG. 2 includes a side-view cross-section illustration 200 and a top-view illustration 202 of one combination of the power component 114 and the transmission element 116 used to generate plasma within the interior volume of the process chamber 102. In most instances, the design and arrangement of these components, as shown in FIG. 2, are based, at least in part, on the ability to form a resonance circuit which amplifies an incoming VHF power signal, from one or more power sources 108 (e.g., VHF energy source 126), that interacts with the process chemistry to generate a high density and low ion energy plasma to treat a microelectronic substrate 110 disposed on the substrate holder 118. In general, a resonance condition exists when the capacitive reactance and inductive reactance of a circuit are of equal magnitude causing the collapsing magnetic fields from an inductive element (e.g., power component 114) to generate an electric current that charges a capacitive element (e.g., transmission element 116) of the circuit, and the process is repeated due to the alternating current generating an oscillating magnetic field in the inductive element which drives a corresponding charging of the capacitive element.

Turning to the cross-section view 200, which is intended to show a cross-section through one of the transmission elements 116 including the transmission antenna 206a and a corresponding power transmission line 204a of the power component 114. The transmission antenna(s) 206a and the power transmission line(s) 204a are designed and arranged to be electromagnetically coupled to each other, such that a magnetic field generated by the alternating current flow through the power transmission lines 204 induces a counter current flow in the transmission antenna(s) 206a. The power transmission line 204a may be electrically or physically isolated from the transmission element 116 by an insulating structure 208 formed or disposed around or proximate to the power transmission line 204. The insulating structure 208 may be made of any non-conductive materials that allow current to flow through the power transmission lines 204 in a controlled and/or predictable manner (e.g., no shorting to the transmission element 116). However, the insulating structure will still allow electromagnetic coupling between the power transmission line 204 and the corresponding transmission antenna 206a. Similarly, the transmission antenna 206a may be disposed within a dielectric structure 210 which physically isolates the transmission antenna 206a the power component 114, such that current flowing through the power transmission line 204a does not flow through the transmission antenna 206a. However, the dielectric structure 210 and the insulating structure 208 are designed and arranged to enable the magnetic field around the power transmission line 204a, generated by the current flow through the power transmission line 204a, to induce current flow in the transmission antenna 206a. The dielectric structure 210 may be made of any dielectric material that electrically isolates the transmission antenna 206a from the power transmission line 204a, but enables the magnetic field generated by the power component 114 to induce a current flow within the transmission antenna 206a. For example, the dielectric structure 210 may be made of alumina, quartz, silicon carbide, or a combination thereof and may include a yttrium oxide coating on at least one surface (e.g., exposed surface 212) that may be exposed to plasma or process chemistry during substrate treatments. In one embodiment, the exposed surface 212 may be the portion of the dielectric structure 210 that is opposite the substrate holder 118 or opposite of the interface 214 between the insulating structure 208 and the dielectric structure 210. In the FIG. 2 embodiment, the interface 214 does not include an air gap or intermediate layer between the power component 114 and transmission element 116, but in other embodiments, an air gap or intermediate layer may exist to enhance electrical isolation or to isolate the power component 114 from plasma or process chemistry.

Additionally, the design and arrangement of the power component 114 and transmission antennas 206a is intended to achieve a resonance condition that amplifies the electromagnetic fields in the vicinity of the transmission antenna 206a, these fields resulting from the electromagnetic power emanating from power source(s) 108 and coupled by the power component 114. The resonance condition may exist based, at least in part, a combination of one or more design criteria that may include, but is not limited to, the impedance of the transmission antenna 206a, impedance of the power transmission line 204, the operating frequency of the VHF power source 126, and/or the dielectric constants of the insulating structure 208 and the dielectric structure 210. Impedance is an indication of the resistance or reactance of a conductive element to the flow of alternating current. More particularly, in Cartesian form, impedance may be viewed as resistance of the circuit and the circuit's resistance to a change in current or voltage based, at least in part, on the inductance or capacitance of the circuit (e.g., power transmission line 204, transmission antenna 206a, etc.). Hence, impedance is dependent upon the size, shape, and composition of the circuit's components, but may also be influenced by the rate of current and voltage changes within the circuit. Hence, the impedance is a reflection of the circuit's physical design and operating conditions that can be measured as the opposition to the change in voltage (e.g., capacitive reactance) and the opposition to the change of current (e.g., inductive reactance) through the circuit. In resonance conditions, the capacitive reactance and inductive reactance of a circuit are of equal magnitude causing the collapsing magnetic fields from an inductive element (e.g., power component 114) to generate an electric current that charges a capacitive element (e.g., transmission element 116) of the circuit, and the process is repeated due to the alternating current generating an oscillating magnetic field in the inductive element. Typically, the resonance condition is achieved at particular resonance frequencies (e.g., power source 108 operating frequency) that initiate the resonance condition in a predictable and controllable manner. As a result of the resonance condition, the amplitude of the electromagnetic field emitted from the resonance circuit (e.g., transmission antenna 206a, power transmission line 204a, VHF energy source 126) will be greater than the amplitude of the incoming power signal to the power component 114. However, other design considerations, as understood by a person of ordinary skill in the art, may be accounted for in many transmission element 116 embodiments.

For example, in addition to the impedance, the design consideration of the resonant circuit should consider the wavelength of the incoming power, such that the transmission antenna 206 length could be long as the incoming ¼, ½, or full wavelength. In VHF applications (e.g., 30 MHz-300 MHz), the transmission antenna 206a length may range between 250 mm and 2500 mm for ¼ wavelength applications and 500 mm to 5000 mm for ½ wavelength applications, and up to 10,000 mm for full wavelength applications. Hence, in some instances, the length of the transmission antenna 206 may be larger than the diameter of the process chamber 102, if laid out end to end. However, this issue may be remedied by distributing or arranging transmission antenna 206 within the dielectric structure 210 to allow the relatively long transmission antenna 206a to be disposed within the process chamber 102, despite the length being larger than the diameter of the process chamber 102. For example, the transmission antenna 206a may include a continuous antenna with several portions that are deposited or embedded within the dielectric structure 210, such that electrical current can flow along each portion of the antenna transmission antenna 206a that is bent back on itself as shown in FIG. 2. The portions may be arranged to include a portion of the transmission antenna 206a capable of being directly electromagnetically coupled to the power transmission line 204a that induces the current flow within the transmission antenna 206a, a portion of the transmission antenna 206a capable of ionizing gas within the process chamber 102, and a portion of the transmission antenna 206a used to connect the two aforementioned portions together, wherein a combination of these portions provide sufficient length for the transmission antenna 206a to form a resonant circuit with a VHF signal.

For example, as shown in FIG. 2, the transmission antenna 206a may include a first portion 220 that is opposite the bottom surface 222 of the dielectric structure 210, a second portion (e.g., first coupling portion 224a, second coupling portion 224b) that is opposite the top surface 216, and a third portion (e.g., first exterior portion 226a, second exterior portion 226b, first interior portion 226c, and second interior portion 226d) that is disposed between the first portion 220 and the second portion. These portions may be arranged in variety of designs and configurations, such that the overall length of the combined and/or continuous portions will enable a VHF standing wave, disposed along the transmission antenna 206a, to reside entirely within the process chamber 102. In this specific embodiment, as shown in FIG. 2, the first portion 220 of the transmission antenna 206a extends in a continuous manner in a plane that is opposite and/or parallel to the bottom surface 222 with a first end being connected to the first exterior portion 226a and the opposite end being connected to the second exterior portion 226b of the transmission antenna 206a, with the respective ends of a first coupling portion 224a and a second coupling portion 224b being electrically connected or paired with the respective ends of the first exterior portion 226a or the second exterior portion 226b, wherein the opposite ends of the coupling portions are connected to the respective ends of the first interior portion 226c and second interior portion 226d of the transmission antenna 206a, as shown in FIG. 2. In this embodiment, the interior portions 226c, 226d are symmetrical to each other along a vertical axis disposed between the two portions, but are not required to be symmetrical in other embodiments, and part of the interior portions are bent back on each other to obtain an adequate overall transmission antenna 206a length to obtain a VHF standing wave within the transmission element 116. However, the embodiment shown in FIG. 2 is merely exemplary and the scope of the disclosure should not be limited to this specific embodiment.

In some embodiments, a waveguide element 228 may be disposed between the bent portions of the first and/or second interior portions 226c, 226d to guide the electromagnetic wave propagating along the transmission antenna 206a. In one instance, the waveguide element 228 may be made of a conductive material, similar to the transmission antenna 206a, or alternatively composed of a different material than the transmission antenna 206a. The length and orientation of the waveguide element is dependent upon the design of the first interior portion 226c and second interior portion 226d and may be disposed between and/or long different portions of the third portion that is disposed between the first portion 220 and the second portion. However, the combined length of the first, second, and third portions of the transmission antenna 206 is based, at least in part, on forming a resonance circuit or matching impedance between the transmission antenna 206a, power transmission line 204a, and power source 108 that may apply energy to the power transmission line 204a at a frequency of 30 MHz to 300 MHz.

In the FIG. 2 embodiment, the first portion 220 is the closest to the process chemistry or plasma 120 and the electromagnetic field radiating from the first portion 220 may ionize any process chemistry disposed within the plasma chamber 102 during the process treatment. The dimensions of the first portion 220 may range between 50 mm and 500 mm depending on the size of the substrate 110, the process chamber 102, and/or desired resonance conditions (e.g., transmission element impedance, source frequency). In most embodiments, the length of the first portion will be between 200 mm and 400 mm, but in one specific embodiment the first portion 220 will be about 350 mm. However, the FIG. 2 embodiment is used for the purposes of explanation, and the first portion length may be larger than 500 mm in certain large substrate applications, such as flat-panel displays or other industrial applications.

In some embodiments, the transmission element 116 may be configured with a dual transmission antennas 206a, 206b as shown in the top-view illustration 202 of FIG. 2 with each transmission element 116 being of the same or similar design. For the purposes of illustration and explanation, the top-view illustration 202 excludes the insulating structure 208 of the power component 114 and the dielectric structure 210 is illustrated as being transparent to show the details of the transmission antennas 206a, 206b the waveguide 228, and the first and second coupling interfaces (e.g., 230a, 230b).

In the FIG. 2 embodiment, the transmission antennas 206 may be adjacent to each other and capable of being electromagnetically coupled to each other using one or more coupling interfaces (e.g., first coupling interface 230a, second coupling interface 230b). In the FIG. 2 embodiment, the transmission antennas 206 are placed adjacent and parallel to each along their length with the coupling interfaces 230a, 230b extending perpendicularly out from below the transmission antennas 206a, 206b such that the coupling interfaces 230a, 230b form parallel plate capacitors with the transmission antennas 206a, 206b. The first coupling interface 230a extends from below first interior portion 226c of the first transmission antenna 206a across to be below the first interior portion (not shown in top-view 202) of the second transmission antenna 206b. Similarly, the second coupling interface 230b extends from below the second interior portion 226d of the first transmission antenna 206a across to be below the second interior portion (not shown in the top-view 202) of the second transmission antenna 206b. In this embodiment, the transmission antennas 206a, 206b can be coupled to each other by simultaneously forming parallel plate capacitors between the respective coupling interfaces 230a, 230b and the transmission antennas 206a, 206b.

The coupling interfaces 230a, 230B enable the electromagnetic energy of each of the transmission antennas 206a, 206b to interact with each other to modulate the electromagnetic energy, via the theory of superposition, which is exposed to the process chemistry at the bottom surface 222 and/or in the process chamber 102. The first coupling interface 230a and the second coupling interface 230b form the basis of the coupling component embedded within the dielectric structure 210. The coupling components or interfaces may be made of a conductive material, similar to or different from the transmission antenna 206a. In another embodiment of FIG. 1, each transmission element 116 is powered from separate power sources 108 and receive electromagnetic energy from their own corresponding power transmission lines 204 (e.g., power transmission antenna).

Figure 3:
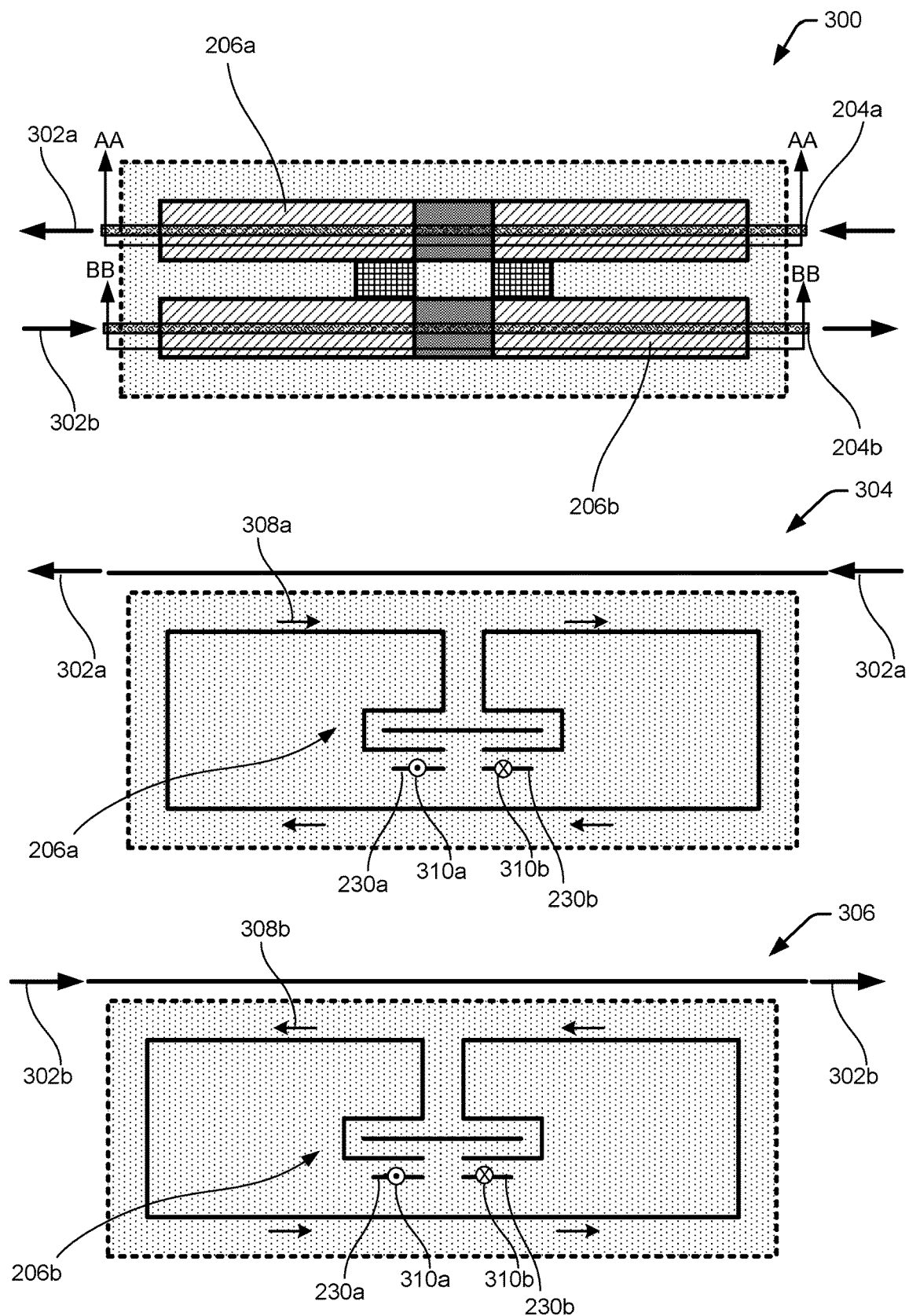
FIG. 3 includes a top-view and side-view cross-section illustrations highlighting the current flow direction through the power antennas, each transmission antenna, and a coupling component for the transmission antennas according to one or more anti-parallel embodiments of the disclosure.
Figure 4:
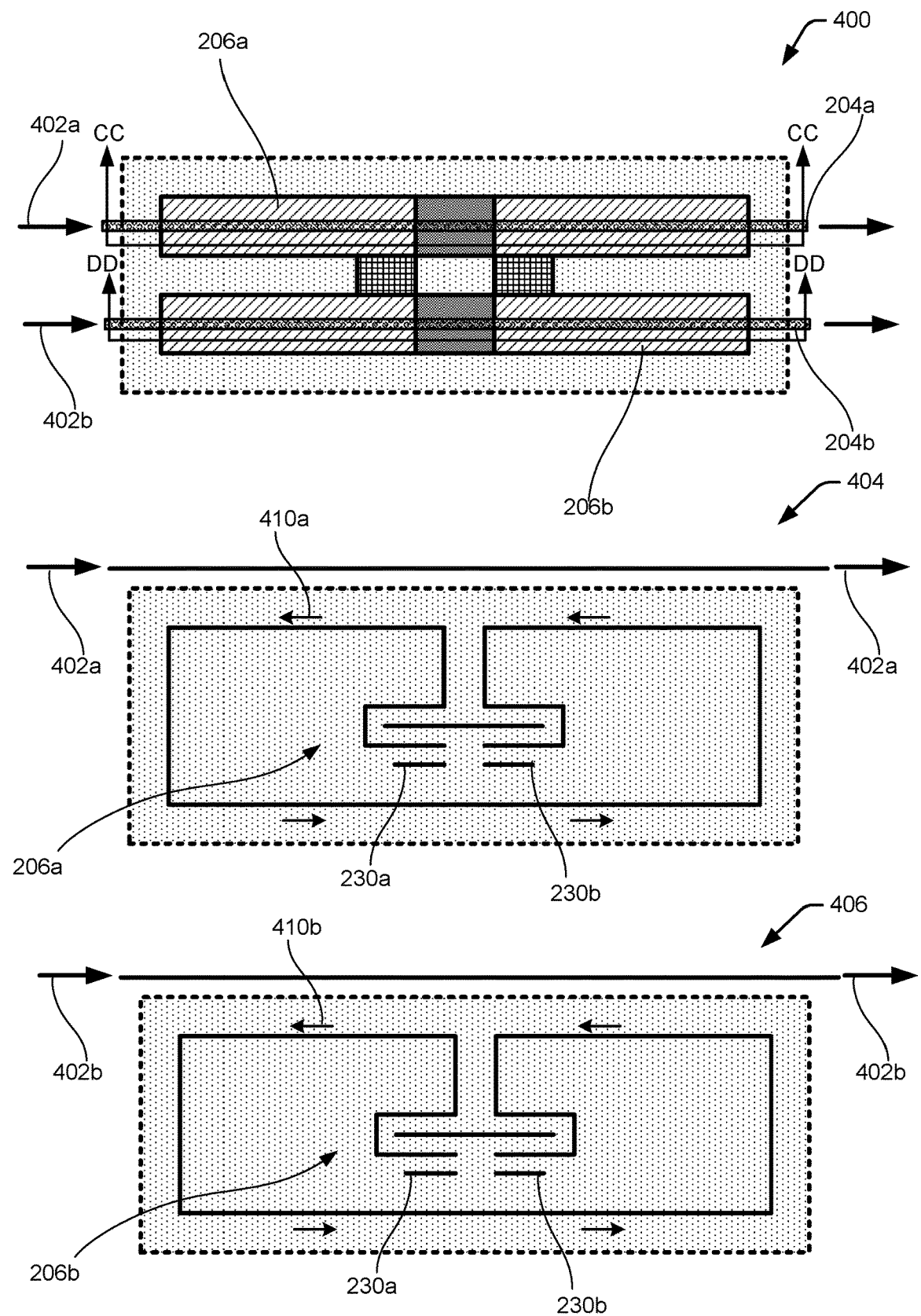
FIG. 4 includes a top-view and side-view cross-section illustrations highlighting the current flow direction through the power antennas, each transmission antenna, and a coupling component for the transmission antennas according to one or more parallel embodiments of the disclosure.

FIGS. 3 & 4 illustrate implementations of a dual transmission antenna illustrated in the top view 202 of FIG. 2. In this embodiment, corresponding power sources 108 apply electromagnetic energy to the each of the transmission antennas 206a, 206b in a complementary or non-complementary mode to modulate the energy transmitted from the transmission elements 116. For example, a complementary interaction occurs when the current flow through each transmission antenna 206a, 206b is flowing in the same direction (e.g., parallel to the other), such that the electromagnetic energy of similar frequency and/or phase are integrated together, as understood under the principle of superposition, to generate a higher magnitude wave. In this case the currents flowing through the two portions 220 of their corresponding transmission antennas 206 produce electromagnetic fields which substantially reinforce each other and therefore reach into the gap containing the plasma. In a non-complementary interaction, the current flow through each transmission antenna 206a, 206b in the opposite direction (e.g., anti-parallel to each other), such that the two electromagnetic waves may have the same frequency and/or amplitude but not the same phase angle. In this instance, the interaction of the waves is modulating or attenuating the electromagnetic energy reaching the process chemistry, such that the distribution or uniformity of the energy can be modulated or adjusted as needed. In this case the currents flowing through portions (e.g., first portion 220) of their corresponding transmission antennas 206a, 206b flow in opposite directions and therefore the electromagnetic fields that they produce are substantially opposing each other. At distances far from the two transmission antennas 206a, 206b no net field is produced and thus the fields are more tightly confined to the region close to the transmission element 116.

FIG. 3 illustrates an example of non-complementary interaction between dual transmission antennas (e.g., first transmission antenna 206a, second transmission antenna 206b), as seen in the top view 300 with anti-parallel power signals being introduced to the power transmission lines (e.g., first power transmission line 204a, second power transmission line 204b) which can similarly induce antiparallel current flows between the two transmission antennas 206a, 206b and anti-parallel current flows in the corresponding coupling interfaces (e.g., first coupling interface 230a, second coupling interface 230b). As shown in the top view 300, the incoming current from the power sources 108 are in opposite directions, in that the first power current 302a flow is in the opposite direction as the second power current 302b flow. Likewise, the current induced in the corresponding transmission antennas (first transmission antenna 206a, second transmission antenna 206b) by the current in the power transmission lines (first power transmission line 204a, second power transmission line 204b) will be in opposite directions.

Turning to tie cross-sections of FIG. 3, the first cross-section 304 of the first transmission antenna 206a being representative of viewing the antenna as indicated via the AA-AA cross section line shown in the top view 300. Similarly, the second cross-section 306 of the second transmission antenna 206b being representative of viewing the antenna via the BB-BB cross section line shown in the top view 300. FIGS. 3 & 4 use the third angle projection convention for these cross section line. In the first cross-section 304, the first power current 302a flows through the first power transmission line 204a generating an electromagnetic field (not shown) that induces the first transmission current 308a flow through the first transmission antenna 206a and this current will oscillate in a similar manner as the first power current 302a. Likewise, the second power current 302b, flowing in the opposite direction of the first power current 302a, will induce the second transmission current 308b through the second transmission antenna 206b in the opposite, or anti-parallel, direction. In this way, the combination of the alternating power signals generates an oscillating potential difference between the first transmission antenna 206a and the second transmission antenna 206b, which influences the capacitive coupling, between the transmission antennas 206a, 206b, enabled via the coupling interfaces 230a, 230h such that current flow induced in the first coupling interface 230a and the second coupling interface 230b are also oscillating in opposite directions forming oscillating electromagnetic fields (e.g., first coupled field 310a, second coupled field 310b) along each coupling interface. We denote using the arrow conventions the direction of the RF current in the coupling elements 230a and 230b at the same time that the currents have the directions shown by the arrows above 308a and 308b. The dot in the circle indicates that the current corresponding to the coupled field is flowing out of the plane of the Figure towards the viewer and the cross within a circle indicates that the current corresponding to the coupled field is flowing into the plane of the Figure away from the viewer. Thus referring to cross section AA, first transmission current 308a flows along and down to the first transmission antenna 206a element just above the first coupling interface 230a, wherein the current flow 308a induces a current flow within the first coupling interface 230a whereby generating the first coupled field 310a around the first coupling interface 230a in a counterclockwise direction. Accordingly, the second coupled field 310b is formed around the second coupling interface 230b in a clockwise direction based on the current flowing in the opposite direction of the first coupling interface 230a.

FIG. 4 illustrates an example of complimentary interaction between dual transmission elements first transmission antenna 206a, second transmission antenna 206b), as seen in the top view 300 with parallel power signals being introduced to the power transmission lines (e.g., first power transmission line 204a, second power transmission line 204b) Because the currents are parallel to each other in this case no current flows in the coupling elements 230a and 230b. As shown in the top view 400, the incoming current from the power sources 108 are in the same direction (e.g., first parallel power current 402a, second parallel power current 402b). Likewise, the current induced in the corresponding transmission antennas (first transmission antenna 206a, second transmission antenna 206h) by the power transmission line currents will be in the opposite direction of the current flowing through the power transmission lines 402a, 402b), Turning to the cross-sections of FIG. 4, the first cross-section 404 of the first transmission antenna 206a being representative of viewing the element as indicated via the CC-CC cross section line shown in the top view 400. Similarly, the second cross-section 406 of the second transmission antenna 206b being representative of viewing the element via the DD-DD cross section line shown in the top view 400. In the first cross-section 404, the first power current 402a flows through the first power transmission line 204a generating an electromagnetic field (not shown) that induces the first parallel transmission current 410a flow through the first transmission antenna 206a and this current will oscillate in a similar manner as the first parallel current 402a. Likewise, the second parallel current 402b, flowing in the same direction as the first parallel current 402a, will induce the second parallel transmission current 410b through the second transmission antenna 206b in the same, or parallel, direction. Because the currents are flowing the same directions in transmission antennas 206a and 206b, there are no currents within the coupling elements 230a and 230b. Because of this the resonant modes in which the currents are parallel and in which the currents are anti-parallel have different resonant frequencies. More over the fields which are generated beneath the pair of transmission antennas 206a and 206b differ, in the case of parallel currents extending further from the elements than in the case of the anti-parallel current flows. By exciting the structures at the right frequency the desired parallel versus anti-parallel mode can be excited which affects the distance that the fields penetrate into the plasma. Because Maxwell's equations are linear, it is possible to superimpose two solutions and therefore the two modes can be simultaneously excited each to a varying relative degree compared to the other and thus the extent of the field penetrating into the plasma varied continuously.

The following Detailed Description refers to accompanying drawings to illustrate exemplary embodiments consistent within the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

"Substrate" or "Microelectronic substrate" as used herein generically refers to the object being processed in accordance with the embodiments described herein. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A device, comprising:
a plasma processing chamber comprising an interior volume, a substrate holder disposed within the interior volume; and a power source disposed outside of the interior volume;
a power component coupled to the plasma processing chamber, the power component comprising one or more power transmission lines electrically connected to the power source;
a transmission element disposed between the power component and the substrate holder, the transmission element being electrically insulated from the one or more power transmission lines and arranged adjacent to at least one of the one or more power transmission lines to permit electromagnetic coupling between the at least one power transmission line and the transmission element, the transmission element comprising:
a dielectric structure comprising a surface that is opposite the substrate holder; and
one or more transmission antennas having an overall length configured to enable a standing wave at a frequency of 30 MHz to 300 MHz, the one or more transmission antennas being embedded within the dielectric structure such that the dielectric structure blocks current flow from the at least one power transmission line to the one or more transmission antennas but permits said electromagnetic coupling between the at least one power transmission line and the one or more transmission antennas, wherein each of the one or more transmission antennas comprises a conductive structure that is folded forming an open loop including plurality of vertical portions of each of the transmission antennas that extend along a vertical direction from the power component to the substrate holder.

2. The device of claim 1, wherein the power component comprises two or more power transmission lines electrically connected to the power source.

3. The device of claim 2, wherein the transmission antenna comprises two or more transmission antennas being arranged to be electromagnetically coupled with a corresponding power transmission line.

4. The device of claim 1, wherein the dielectric structure comprises alumina, quartz, silicon carbide, or combination thereof.

5. The device of claim 1, wherein the dielectric structure comprises an yttrium oxide coating on at least one surface.

6. The device of claim 1, wherein the transmission antenna comprises two or more transmission antennas being arranged to be electromagnetically coupled with a corresponding power transmission line of the power component, and the dielectric structure comprises a coupling component embedded within the dielectric structure, the coupling component comprising a conductive element arranged to form a capacitor between the two transmission antennas.

7. The device of claim 1, wherein the transmission antenna comprises a length based, at least in part, on forming a resonance circuit between the power transmission line and the transmission element when the power source applies energy to the power transmission line at a frequency of 30 MHz to 300 MHz.

8. The device of claim 7, wherein the resonance circuit is based, at least in part, on impedance of the transmission antenna.

9. The device of claim 1, wherein the transmission antenna comprises a length based, at least in part, on impedance matching between the transmission antenna, the power transmission line, and the power source.

10. The device of claim 1, wherein the power source comprises an operating frequency range of 30 MHz to 300 MHz.

11. The device of claim 1, wherein the plasma processing chamber comprises two or more transmission elements.

12. The device of claim 1, wherein,
the conductive structure of each antenna further comprises a plurality of horizontal portions extending in a direction along a surface of the substrate holder, each horizontal portion being provided at a different distance from the substrate holder along the vertical direction, and
each vertical portion is connected to at least one of said horizontal portions by at least one fold.

* * * * *